United States Patent
Wang et al.

(10) Patent No.: US 9,905,287 B2
(45) Date of Patent: *Feb. 27, 2018

(54) ASYMMETRICAL EMPHASIS IN A MEMORY DATA BUS DRIVER

(71) Applicant: Integrated Device Technology, Inc., San Jose, CA (US)

(72) Inventors: Yanbo Wang, Duluth, GA (US); Praveen Rajan Singh, Alphareatta, GA (US); Yue Yu, Johns Creek, GA (US); Craig DeSimone, Dacula, GA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 24 days.

This patent is subject to a terminal disclaimer.

(21) Appl. No.: 15/480,616

(22) Filed: Apr. 6, 2017

(65) Prior Publication Data

US 2017/0212847 A1 Jul. 27, 2017

Related U.S. Application Data

(63) Continuation of application No. 14/956,955, filed on Dec. 2, 2015, now Pat. No. 9,653,147.

(51) Int. Cl.
*G11C 11/4093* (2006.01)
*G06F 13/40* (2006.01)
*G11C 11/4076* (2006.01)
*H04L 25/02* (2006.01)

(52) U.S. Cl.
CPC ...... *G11C 11/4093* (2013.01); *G06F 13/4068* (2013.01); *G06F 13/4072* (2013.01); *G11C 11/4076* (2013.01); *H04L 25/028* (2013.01); *H04L 25/0286* (2013.01)

(58) Field of Classification Search
CPC ............. G11C 11/4076; G11C 11/4093; H04L 25/028; H04L 25/0286; G06F 13/4068; G06F 13/4072
See application file for complete search history.

(56) References Cited

U.S. PATENT DOCUMENTS

| | | | |
|---|---|---|---|
| 7,215,144 B2 | 5/2007 | Mitby et al. | 326/82 |
| 7,579,874 B2 | 8/2009 | Chen | 326/26 |
| 7,683,656 B1 | 3/2010 | Ho | 326/21 |
| 7,956,645 B2 | 6/2011 | Momtaz | 326/86 |
| 8,089,795 B2 | 1/2012 | Rajan | 365/63 |
| 9,172,360 B2 * | 10/2015 | Tsunoda | H03K 5/1252 |
| 9,231,706 B2 * | 1/2016 | Tsunoda | H03K 5/1565 |
| 2014/0176196 A1 | 6/2014 | Li et al. | |

OTHER PUBLICATIONS

Texas Instruments, ONET1130EP 11.7 Gbps Transceiver with Modulator Driver, pp. 1-50, Jun. 2015 Revised Jul. 2015.

* cited by examiner

*Primary Examiner* — Harry W Byrne
*Assistant Examiner* — R Lance Reidlinger
(74) *Attorney, Agent, or Firm* — Christopher P. Maiorana, PC

(57) ABSTRACT

An apparatus includes an interface and a circuit. The interface may be configured to generate a read signal that carries read data from a memory channel. The circuit may be configured to (i) modify the read signal with a de-emphasis on each pull up of the read signal and a pre-emphasis on each pull down of the read signal and (ii) transfer the read signal as modified to a memory controller.

18 Claims, 7 Drawing Sheets

ASYMMETRICAL EMPHASIS IN A MEMORY DATA BUS DRIVER

This application relates to U.S. Ser. No. 14/956,955, filed Dec. 2, 2015, which is incorporated by reference in its entirety.

FIELD OF THE INVENTION

The present invention relates to memory generally and, more particularly, to a method and/or apparatus for implementing an asymmetrical emphasis in a memory data bus driver.

BACKGROUND OF THE INVENTION

Capacitive and inductive load impedances on output drivers of conventional memory cards result in weak output eye performance at high frequencies. Distortion caused by pins, connectors and traces from the memory card across a data bus to other circuitry limits an upper frequency for reliable data transmission. Degradation of the output eye results in poorer receiver margin tests. In conventional driver designs, single symmetrical emphasis techniques are implemented to deal with the degradation. Increasing a drive strength of the output drivers does not stop the degradation at the higher frequencies depending on particular channel performances.

It would be desirable to implement an asymmetrical emphasis in a memory data bus driver.

SUMMARY OF THE INVENTION

The present invention concerns an apparatus including an interface and a circuit. The interface may be configured to generate a read signal that carries read data from a memory channel. The circuit may be configured to (i) modify the read signal with a de-emphasis on each pull up of the read signal and a pre-emphasis on each pull down of the read signal and (ii) transfer the read signal as modified to a memory controller.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the present invention include providing a memory data bus driver that may (i) provide asymmetrical emphasis, (ii) pre-emphasize an output signal on each pull down, (iii) de-emphasize the output signal on each pull up, (iv) improve an output eye performance, (v) improve an integrity of the output signal at a receiving end, (vi) improve receiver margin tests and/or (vii) be cost effective to implement.

In various embodiments, emphasis provided by a memory data bus driver generally includes pre-emphasis on each pull down and de-emphasis on each pull up of a read data signal driven onto a data bus for transfer to a memory controller and/or other circuitry. The pre-emphasis may pull a read data signal line with different magnitude currents than the de-emphasis as a function of time. For example, the pre-emphasis may use an impedance early in a transition that is lower than an impedance used by the de-emphasis at the same relative time in an opposite-polarity transition.

The pre-emphasis/de-emphasis is generally applied to transition edges in the read data signal. The asymmetrical driver emphasis may increase and/or optimize an output eye performance (or opening) for a memory system. The pre-emphasis and the de-emphasis are normally not used together in common single driver designs, especially in data channels with an impedance to a positive rail (e.g., VDD) of a power supply and another impedance to a negative rail (e.g., ground) of the power supply. In double data rate fourth generation (DDR4) applications, a pull up impedance may be specified to connect to the positive rail VDD on the channel, so a natural imbalance generally exists. The DDR4 specification may also include impedance linearity criteria.

Figure 1:
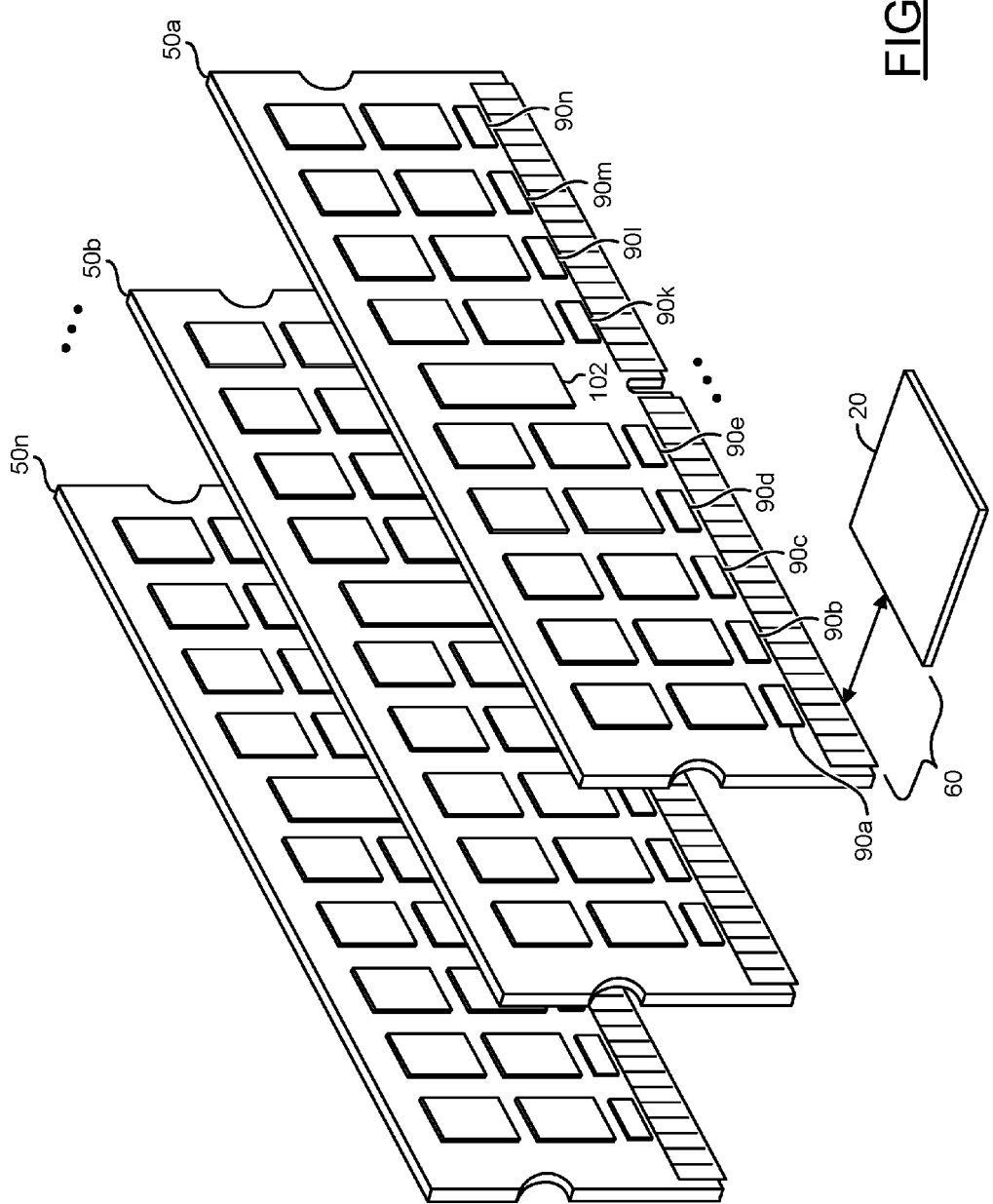
FIG. 1 is a diagram illustrating an example embodiment.

Referring to FIG. 1, a diagram illustrating a number of example circuits 50a-50n are shown. In an example, circuits 50a-50n may be implemented as memory modules (or boards). For example, the memory modules 50a-50n may be implemented as double data rate fourth generation (DDR4) synchronous dynamic random-access memory (SDRAM) modules. The memory modules 50a-50n may comprise a number of blocks (or circuits) 90a-90n, a block (or circuit) 102, and/or various other blocks, circuits, pins, connectors and/or traces. The circuits 90a-90n may be configured as data buffers. The circuit 102 may be implemented as a registered clock driver (RCD). In an example, the RCD circuit 102 may be implemented as a DDR4 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may be a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may be DDR4 SDRAM memory modules. The DDR4 SDRAM memory modules 50a-50n may have a memory module density of 512 gigabyte (GB), terabyte, or higher per module (e.g., compared to 128 GB per dual in-line memory module (DIMM) in DDR3). The DDR4 SDRAM memory modules 50a-50n may operate at voltages of 1.2-1.35 volts (V) with a frequency between 800-2133 megahertz (MHZ) (e.g., compared to 1.5-1.65V at frequencies between 400-1067 MHz in DDR3). In some embodiments, the memory modules 50a-50n may be implemented as low voltage DDR4 and operate at 1.05V. For example, the DDR4 SDRAM memory modules 50a-50n may implement 35% power savings compared to DDR3 memory. The DDR4 SDRAM memory modules 50a-50n may transfer data at speeds of 2.13-4.26 giga-transfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM) or DDR4 registered DIMM (RDIMM). The data buffers 90a-90n may allow the memory modules 50a-50n in a DDR4 LRDIMM configuration to operate at higher bandwidth and/or at higher capacities compared to DDR4 RDIMM (e.g., 1333 MT/s for DDR4 LRDIMM compared to 1067 MT/s for DDR4 RDIMM at 384 GB capacity). For example, compared to DDR4 RDIMM configurations, the DDR4 LRDIMM configuration of the memory modules 50a-50n may allow improved signal integrity on data signals, lower component latency through the data buffers 90a-90n and/or better intelligence and/or post-buffer awareness by the memory controller 20.

Figure 2:
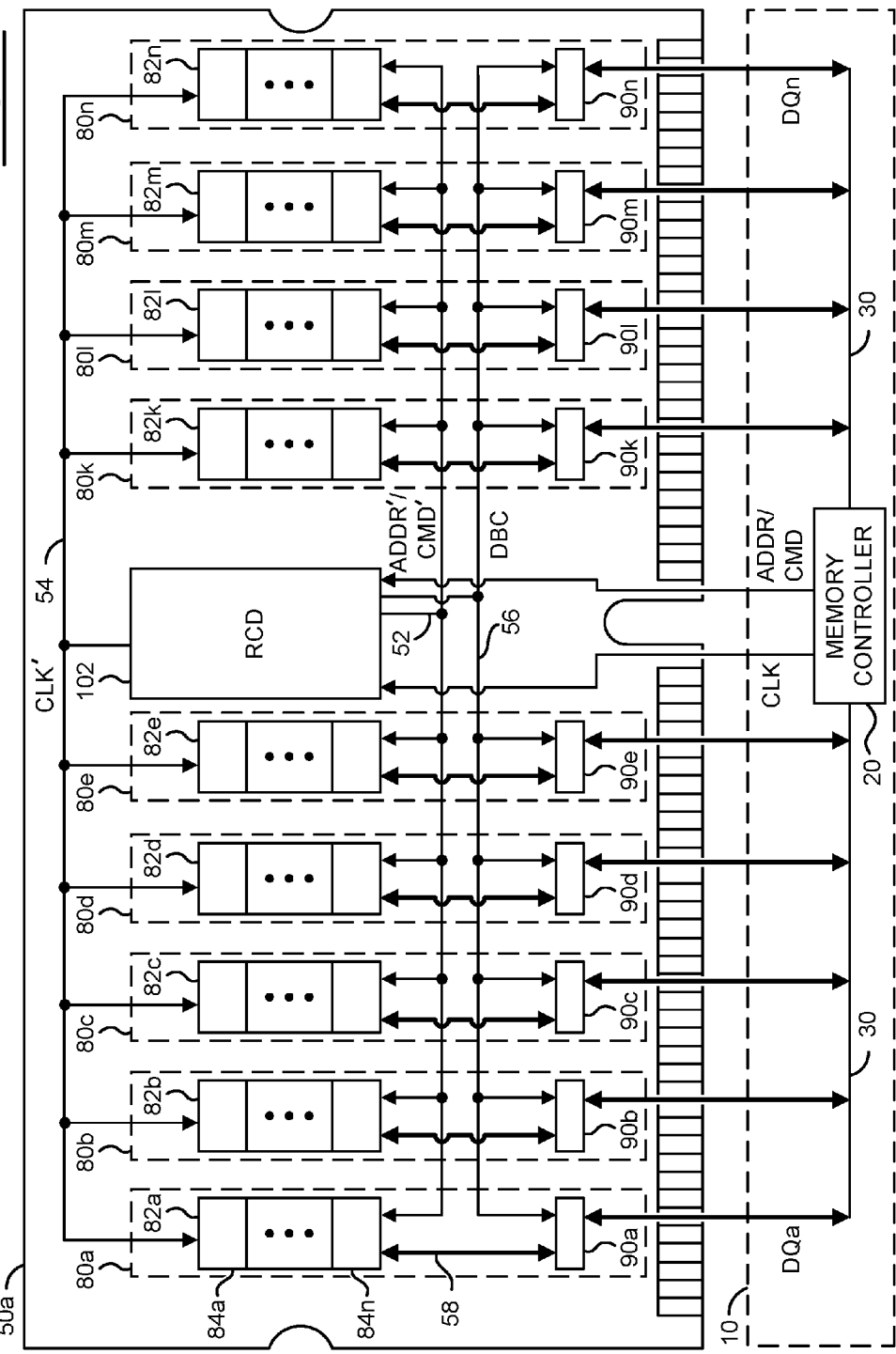
FIG. 2 is a block diagram illustrating a memory module.

Referring to FIG. 2, a block diagram 50a illustrating a memory module is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 102. The circuits 80a-80n may implement data paths of the memory module 50a. For example, the data path 80a may include the blocks 82a and/or the data buffer 90a. The data paths 80b-80n may have a similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 102. A data bus 30 may be connected between the memory controller and the data paths 80a-80n. The memory controller 20 may generate and/or receive data signals (e.g., DQa-DQn) that may be presented/received from the data bus 30. The signals DQa-DQn may be presented to each of the data paths 80a-80n.

The RCD circuit 102 may be configured to communicate with the memory controller 20, the memory channels 82a-82n and/or the data buffers 90a-90n. The RCD circuit 102 may decode instructions received from the memory controller 20. For example, the RCD circuit 102 may receive register command words (RCWs). In another example, the RCD circuit 102 may receive buffer control words (BCWs). The RCD circuit 102 may be configured to train the DRAM chips 84a-84n, the data buffers 90a-90n and/or command and address lines between the memory controller 20. For example, the RCWs may flow from the memory controller 20 to the RCD circuit 102. The RCWs may be used to configure the RCD circuit 102.

The RCD circuit 102 may be used in both LRDIMM and RDIMM configurations. The RCD circuit 102 may implement a 32-bit 1:2 command/address register. The RCD circuit 102 may support an at-speed bus (e.g., a BCOM bus between the RCD circuit 102 and the data buffers 90a-90n). The RCD circuit 102 may implement automatic impedance calibration. The RCD circuit 102 may implement command/address parity checking. The RCD circuit 102 may control register RCW readback. The RCD circuit 102 may implement a 1 MHz inter-integrated circuit ($I^2C$) bus (e.g., a serial bus). Inputs to the RCD circuit 102 may be pseudo-differential using external and/or internal voltages. The clock outputs, command/address outputs, control outputs and/or data buffer control outputs of the RCD circuit 102 may be enabled in groups and independently driven with different strengths.

The RCD circuit 102 may receive the signal CLK and/or the signals ADDR/CMD from the memory controller 20. Various digital logic components of the RCD circuit 102 may be used to generate signals based on the signal CLK and/or the signals ADDR/CMD and/or other signals (e.g., RCWs). The RCD circuit 102 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 102 may generate one or more signals (e.g., DBC). The signals DBC may be presented to the data buffers 90a-90n. The signals DBC may be transmitted on a common bus 56 (e.g., a data buffer control bus).

The data buffers 90a-90n may be configured to receive data from the bus 56. The data buffers 90a-90n may be configured to generate/receive data to/from the bus 30. The bus 30 may comprise traces, pins and/or connections between the memory controller 20 and the data buffers 90a-90n. A bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82*a*-82*n* to the memory controller 20).

The data buffers 90*a*-90*n* may exchange data with the DRAM chips 84*a*-84*n* in small units (e.g., 4-bit nibbles). In various embodiments, the DRAM chips 84*a*-84*n* may be arranged in multiple (e.g., two) sets. For two set/two DRAM chip 84*a*-84*b* implementations, each set may contain a single DRAM chips 84*a*-84*n*. Each DRAM chip 84A-84*b* may be connected to the respective data buffers 90*a*-90*n* through an upper nibble and a lower nibble. For two set/four DRAM chip 84*a*-84*d* implementations, each set may contain two DRAM chips 84*a*-84*d*. A set may be connected to the respective data buffers 90*a*-90*n* through the upper nibble. The other set may be connected to the respective data buffers 90*a*-90*n* through the lower nibble. For two set/eight DRAM chip 84*a*-84*h* implementations, each set may contain four of the DRAM chips 84*a*-84*h*. A set of four DRAM chips 84*a*-84*d* may connect to the respective data buffers 90*a*-90*n* through the upper nibble. The other set of four DRAM chips 84*e*-84*h* may connect to the respective data buffers 90*a*-90*n* through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 90*a*-90*n* may allow DDR4 LRDIMM designs to implement shorter I/O trace lengths compared to DDR3 LRDIMM designs, that use a centralized memory buffer. For example, shorter stubs connected to the memory channels 82*a*-82*n* may result in less pronounced signal reflections (e.g., improved signal integrity). In another example, the shorter traces may result in a reduction in latency (e.g., approximately 1.2 nanoseconds (ns), that is 50% less latency than DDR3 buffer memory). In yet another example, the shorter traces may reduce I/O bus turnaround time. For example, without the distributed data buffers 90*a*-90*n* (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 90*a*-90*n*. The memory modules 50*a*-50*n* may implement 2 millimeter (mm) frontside bus traces and backside traces (e.g., the connectors/pins/traces 60). A propagation delay through the data buffers 90*a*-90*n* may be 33% faster than through a DDR3 memory buffer (e.g., resulting in reduced latency). In some embodiments, the data buffers 90*a*-90*n* may be smaller (e.g., a reduced area parameter) than a data buffer used for DDR3 applications.

Figure 3:
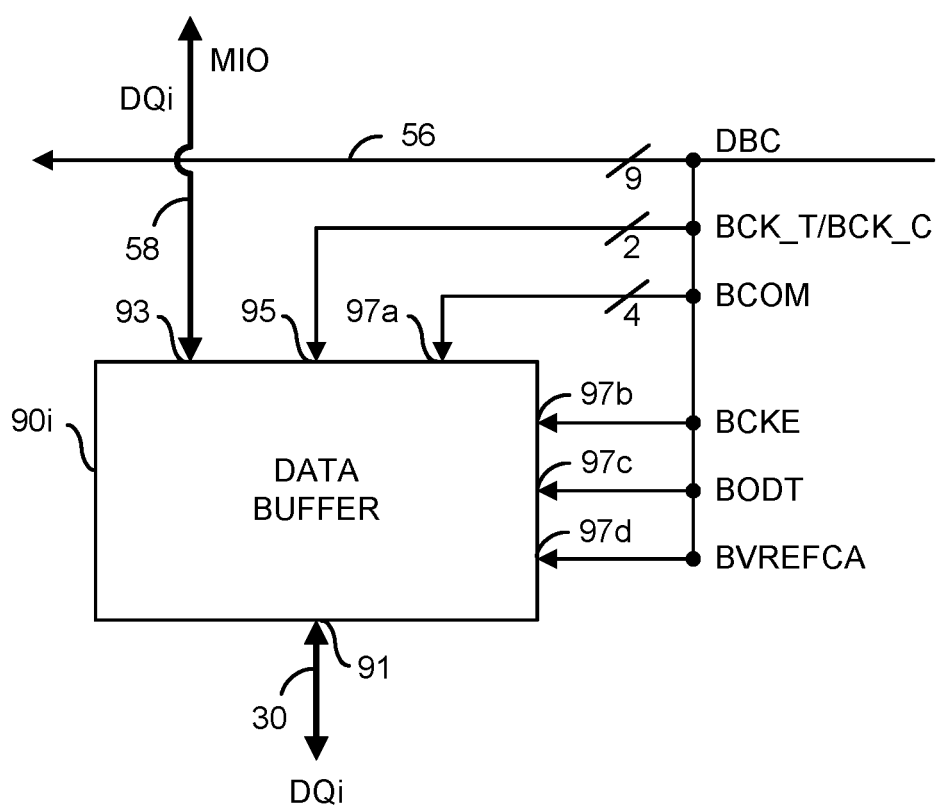
FIG. 3 is a block diagram illustrating input/output for a data buffer.

Referring to FIG. 3, a block diagram illustrating input/output for the data buffer 90*i* is shown. The data buffer 90*i* may be representative of the data buffers 90*a*-90*n*. The data buffer 90*i* is shown having an input/output 91 for presenting/receiving the signals DQi (e.g., the data signal DQ corresponding to the data path 80*i* and/or the data buffer 90*i*) on the bus 30. The data buffer 90*i* is shown having an input/output 93 for presenting/receiving one or more signals (e.g., MIO) to the bus 58. The signals MIO on the bus 58 may be transmitted between the DRAM chips 84*a*-84*n* and the data buffers 90*a*-90*n*. In an example, data from the memory controller 20 may be carried by the signal DQi on the bus 30, presented to the data buffer 90*i*, buffered in the data buffer 90*i*, then transmitted on the bus 58 to the memory channel 82*i*. For example, the bus 58 may transmit a version of the signal DQi (e.g., the signal MIO) between the data buffers 90*a*-90*n* and the corresponding memory channels 82*a*-82*n*). In another example, data from the memory channel 82*i* may be carried by the signal DQi on the bus 58, presented to the data buffer 90*i*, buffered in the data buffer 90*i*, then transmitted on the bus 30 to the memory controller 20.

The data buffer 90*i* is shown receiving the signals DBC. The signals DBC may be presented to each of the data buffers 90*a*-90*n* (e.g., using the data buffer control bus 56). The signals DBC are shown comprising five signals transmitted over 9 pins/bits (e.g., a signal BCK_T/BCK_C, a signal BCOM, a signal BCKE, a signal BODT and/or a signal BVREFCA). The data buffer 90*i* is shown having an input 95 for receiving the signals BCK_T/BCK_C, an input 97*a* for receiving the signal BCOM, an input 97*b* for receiving the signal BCKE, an input 97*c* for receiving the signal BODT, and an input 97*d* for receiving the signal BVREFCA.

The signal BCK_T/BCK_C may be a 2-bit signal representing clocks for the data buffers 90*a*-90*n* (e.g., comprised of a differential signal pair). The signal BCOM may be a 4-bit signal representing data buffer command signals (e.g., comprised of four pins/bits). The signal BCOM may be a unidirectional signal from the RCD circuit 102 to the data buffers 90*a*-90*n*. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (DCKE). The signal BODT may be a function registered dedicated non-encoded signals (DODT). The signal BVREFCA may be a reference voltage for command and control signals.

The data buffers 90*a*-90*n* may receive a set of data buffer commands (e.g., buffer control words (BCWs)) from the signals DBC. The buffer control words may be used to customize operation of the data buffers 90*a*-90*n*. The buffer control words may flow from the memory controller 20, through the RCD circuit 102, to the data buffers 90*a*-90*n*. The buffer control words may be similar to register commands (e.g., register control words (RCW)) used for the RCD circuit 102. Like the register control words (e.g., register commands), the buffer control words (e.g., buffer commands) may look like an MRS7 command, where the address lines are really the payload.

Since the bus 56 is nine pins, the RCD circuit 102 may do more than pass a buffer control word directly through to the data buffers 90*a*-90*n*. The RCD circuit 102 may convert (e.g., multiplex) an MRS7 command format into a buffer control word in a BCOM format. The RCD circuit 102 may map the 12 address bits of the MRS7 command into five separate data transfers, each 4 bits wide. The five data transfers may be set up over the bus 56, back to back. For example, 5 clock cycles plus a parity cycle may be used to complete the buffer command in the buffer control word. Once the buffer control word reaches the data buffers 90*a*-90*n*, the data buffers 90*a*-90*n* may decode the buffer control word, write the buffer control word to a function space of the data buffer, and complete the buffer command in the buffer control word.

A function of the signal BCOM may be to transmit the buffer control words. However, the JEDEC specification for DDR4 SDRAM also specifies that the RCD circuit 102 send all read/write commands and MRS information over the bus 56 (e.g., to allow the data buffers to keep tabs on what the DRAM chips 84*a*-84*n* are doing). In some embodiments, different buffer commands may take a different number of cycles to transfer the information.

The RCD circuit 102 may receive an MRS7 command from the memory controller 20 (e.g., from a host). For example, the host 10 may want to change a parameter (e.g., typically on boot up of a computing device). The RCD circuit 102 may check the MRS7 command to determine whether the address bit 12 is set to 1 (e.g., a logical one). When the address bit 12 of the MRS7 command is set to 1, the RCD circuit 102 may recognize the command as a buffer command (e.g., a command that is not meant for the RCD circuit 102). The RCD circuit 102 may convert the command from the memory controller 20 to a buffer control word and send the buffer control word to the bus 56 and then to the data buffers 90a-90n. The data buffer 90i may write the buffer control word to a function space to complete the command.

The data buffers 90a-90n may be configurable. The buffer commands may allow the memory controller 20 to customize aspects of termination, the signal strength on the DQ lines and/or events (e.g., receiver timing, driver timing, etc.) in both directions (e.g., for both read and write operations). In some embodiments, some of the configurations of the data buffers 90a-90n may be decided based on system level configurations. Generally, most of the configuration of the data buffers 90a-90n may be decided during training steps. During training steps, host controllers (e.g., the memory controller 20) may test and compare results of various training steps to determine an optimal configuration.

The bus 56 may be used to send commands/data to program configuration registers of the data buffers 90a-90n. The bus 56 may also send commands (e.g., data reads and/or data writes) that control data traffic through the data buffers 90a-90n. For example, some commands may optimize power consumption of the data buffers 90a-90n. In another example, read/write delays may be added per data line.

The data buffers 90a-90n may implement dual multi-bit (e.g., 4-bit) bidirectional data registers with differential data strobes. The data buffers 90a-90n may implement automatic impedance calibration. The data buffers 90a-90n may implement BCOM parity checking. The data buffers 90a-90n may implement control register buffer control word readback.

Figure 4:
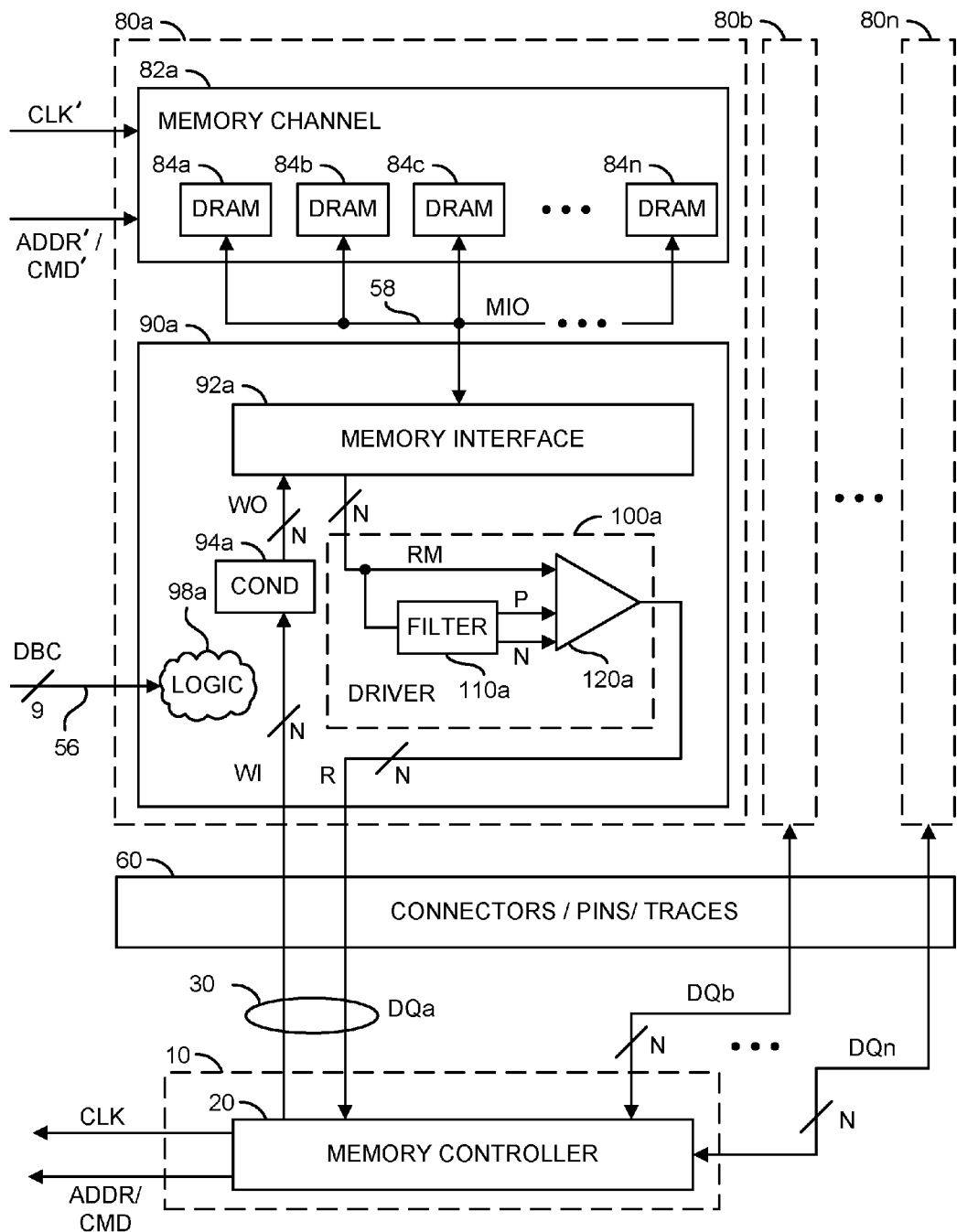
FIG. 4 is a block diagram illustrating a data path.

Referring to FIG. 4, a block diagram illustrating details of the data path 80a is shown. The data paths 80b-80n may have similar configurations. The memory controller 20 is shown generating/receiving the signal DQa over the data bus 30. Similar data signals DQb-DQn may be implemented for the data paths 80b-80n. The data signal DQa may include one or more read signals (e.g., R), and one or more write signals (e.g., WI). In some embodiments, the read signals may be single-ended signals (e.g., the signal R). In some embodiments, the read signals may be implemented as differential pairs. The data signal DQa may include other signals. The composition of the signals comprising DQa may be varied according to the design criteria of a particular implementation. The memory controller 20 may communicate with the data path 80a over the bus 30. The bus 30 may include the connectors/pins/traces 60.

The data buffer 90a may comprise a block (or circuit) 92a, a block (or circuit) 94a, a block (or circuit) 98a, a block (or circuit) 100a and/or input/output pins for the data bus 30 to/from the memory controller 20. The circuit 92a may be implemented as a memory interface. The circuit 94a may be implemented as a conditioner circuit. The data buffer 90a may comprise other logic components circuit 98a. For example, the logic components 98a may receive data from the bus 56. The circuit 100a may implement a driver circuit.

The type, arrangement and/or number of components of the data buffer 90a may be varied according to the design criteria of a particular implementation.

The memory interface 92a may comprise one or more output buffers (not shown). The memory interface 92a may receive a write signal (e.g., WO) from the conditioner circuit 94a. The write signal WO may be transmitted using single-ended lines or differential lines (e.g., traces), depending on the particular implementation. Where a differential write signal is implemented, the memory interface 92a may convert the differential write signal to a single-ended write signal. The single-ended write signal may be transmitted on the bus 58 (e.g., the signal MIO).

The memory interface 92a may receive the read data from the memory channel 82a (e.g., from the DRAM chips 84a-84n) over the bus 58. The memory interface 92a may present the read data in a read memory signal (e.g., RM) to the driver circuit 100a. The driver circuit 100a may generate the read signal R. Where a differential read signal is implemented, the circuit 100a may convert the signal-ended signal RM to the differential signal R. The digital logic 98a and/or other components of the memory interface 92a may be varied according to the design criteria of a particular implementation.

The circuit 94a may implement a conditioner circuit. The conditioner circuit 94a may be operational to buffer and condition write data received in the signal WI. The conditioner circuit 94a may present the write data in the signal WO to the circuit 92a. In various embodiments, the conditioner circuit 94a may generate the signal WO as a differential signal.

The circuit 100a may implement a driver circuit. The circuit 100a generally comprises a block (or circuit) 110a and a block (or circuit) 120a. The read memory signal RM may be received by the circuits 110a and 120a. A positive-side (or pull up) filter signal (e.g., P) may be generated by the circuit 110a and presented to the circuit 120a. A negative-side (or pull down) filter signal (e.g., N) may be generated by the circuit 110a and presented to the circuit 120a. The circuit 120a may generate the read signal R.

Multiple instantiations of the circuit 100a may be provided based on a width of the data exchanged with the DRAM chips 84a-84n and a number of sets of DRAM chips 84a-84n. For example, where each DRAM chip 84a-84n exchanges data in 4-bit units (e.g., nibbles) and two sets of DRAM chips 84a-84n are implemented, the width N of the data in the signals R and RM may be eight (e.g., an upper nibble and a lower nibble), and eight instantiations of the circuit 100a may be implemented.

The circuit 100a may be operational to generate the read signal R with asymmetrical emphasis (e.g., the pre-emphasis is different from the de-emphasis). The asymmetrical emphasis generally applies the de-emphasis on each pull up of the read signal R and the pre-emphasis on each pull down of the read signal R. A duration of the pre-emphasis and the de-emphasis is generally controlled by the circuit 110a via the signal P and the signal N.

Application of the pre-emphasis or the de-emphasis may be based on transitions of the read data in the read memory signal RM. A truth table of the pre-emphasis/de-emphasis applied by the circuit 100a as a function of a current read data state and a previous read data state is shown Table I as follows:

TABLE I

| Previous State | Current State | Driver Response |
|---|---|---|
| 0 | 0 | Normal pull down |
| 0 | 1 | De-emphasized pull up |
| 1 | 0 | Pre-emphasized pull down |
| 1 | 1 | Normal pull up |

The circuit 110a may implement a filter circuit. The circuit 110a is generally operational to generate the positive-side (or pull up) pre-driver signal P and a negative-side (or pull down) pre-driver signal N based on data in the read memory signal RM. Timing of the signals P and N may depend on a direction of a most recent transition of the data in the read memory signal RM and a voltage (or logical state) of the read memory signal RM.

In some embodiments, the signal P may be active while the read data in the read memory signal RM is in the logical high state and inactive while the read data in read memory signal RM is in the logical low state. The signal P may transition from inactive to active a time delay after each rising edge of the read data in the read memory signal RM. The signal P may transition from active to inactive at each falling edge in the read data in the read memory signal RM.

In some embodiments, the signal N may be active while the read data in the read memory signal RM is in the logical low state and inactive while the read data in the signal is in the logical high state. The signal N may transition from inactive to active in response to each falling edge in the read data in the read memory signal RM. The signal N may transition from active to inactive the time delay after each falling edge in the read data in the read memory signal RM.

The circuit 120a may implement a line driver (or buffer) circuit. The circuit 120a is generally operational to generate the read signal R on a wire (or trace, or node, or transmission line) based on the read data in the read memory signal RM, the active/inactive condition of the signal P, and the active/inactive condition of the signal N. The circuit 120a may present a variable pull up impedance that pulls the wire carrying the read signal R up to the positive rail VDD of the power supply. At each rising edge of the read data in the read memory signal RM, the circuit 120a may de-emphasize (or reduce) a pull up capability by increasing a normal impedance between the wire and the positive rail VDD for a predetermined period. Afterwards, the circuit 120a may pull the wire up through the normal pull up impedance. Determination of the predetermined period may be based on simulations of the circuits 50a-50n with the connectors/pins/traces 60 and the circuit 20.

The circuit 120a may present a variable pull down impedance that pulls the wire carrying the read signal R down to the negative raid (or ground) of the power supply. At each falling edge of the read data in the read memory signal RM, the circuit 120a may pre-emphasize (or increase) a pull down capability by decreasing a normal pull down impedance from the wire to the negative rail GND for the predetermined period. Afterwards, the circuit 120a may pull down the wire through the normal pull down impedance.

Figure 5:
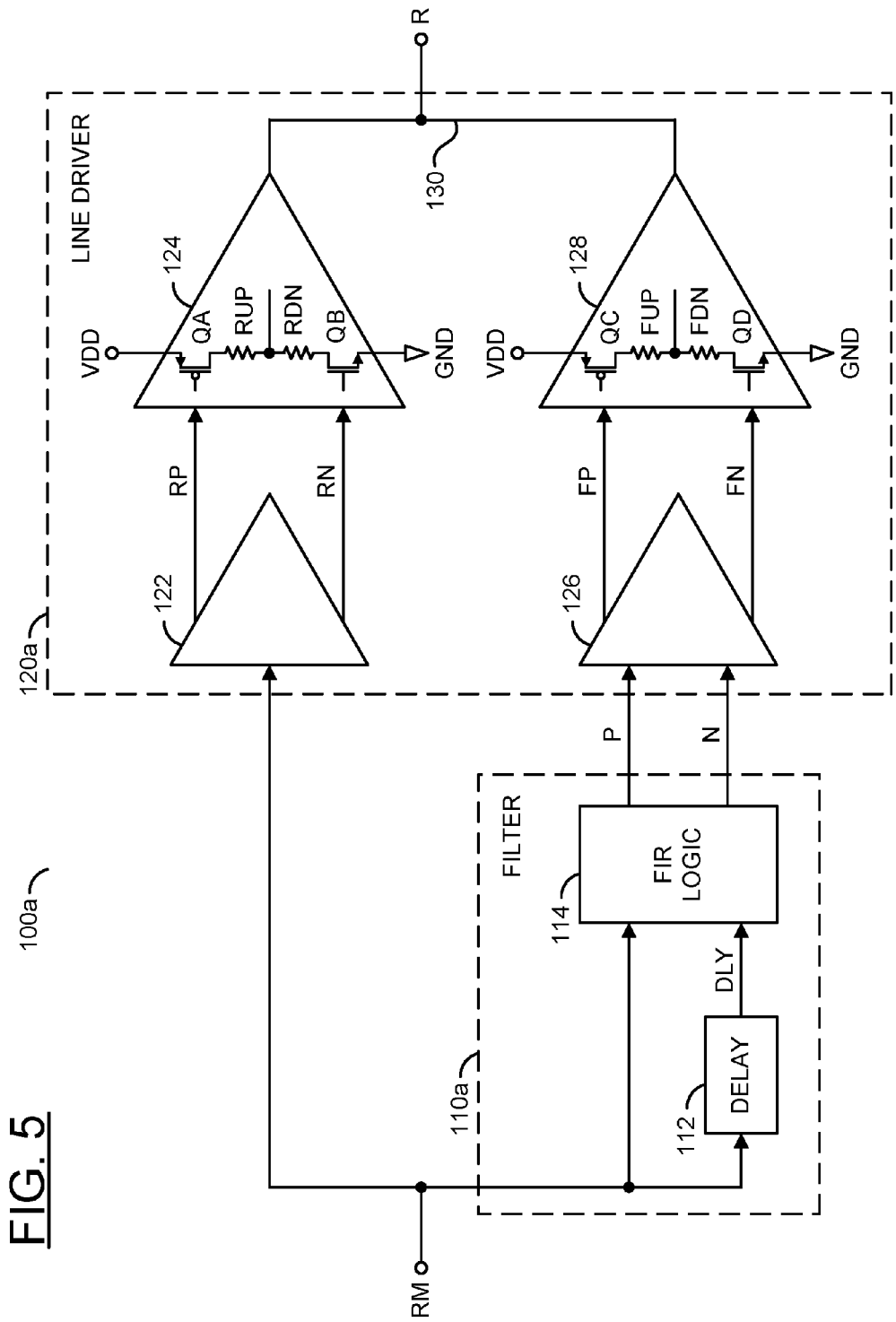
FIG. 5 is a detailed block diagram of a driver circuit in accordance with an embodiment of the present invention.

Referring to FIG. 5, a detailed block diagram of the circuit 110a is shown in accordance with an embodiment of the present invention. The circuit 110a generally comprises a block (or circuit) 112 and a block (or circuit) 114. The circuit 120a generally comprises a block (or circuit) 122, a block (or circuit) 124, a block (or circuit) 126, a block (or circuit) 128 and the wire (or trace or node or circuit) 130. The circuits 122 to 130 may be represented as modules and/or blocks. In various embodiments, the circuits 122 to 130 are implemented in hardware circuitry. However, executable code (e.g., software, firmware, microcode, programming instructions, etc.) embodied in a storage medium may be used to represent the circuits 122 to 130 in operations (e.g., design, modeling, simulation, tape out, etc.) utilizing one or more electronic design tools.

The read memory signal RM may be received by the circuits 112, 114 and 122. A signal (e.g., DLY) may be generated by the circuit 112 and presented to the circuit 114. The signal DLY may be a delayed version of the read memory signal RM. The signals P and N may be generated by the circuit 114 and presented to the circuit 126. The circuit 122 may generate two signals (e.g., RP and RN) received by the circuit 124. The circuit 126 may generate two signals (e.g., FP and FN) received by the circuit 128. The read signal R may be generated by a combination of the circuits 124 and 128 operating in parallel on the wire 130.

The circuit 112 may implement a delay circuit. The circuit 112 is generally operational to delay the read data in the read memory signal RM to generate a delayed version of the read data in the signal DLY. The delay time may be programmable via the circuit 102 via the signal BCOM on the bus 56. The delay time is generally a fraction of a synchronization (or clocking) period of the read data in the read memory signal RM. Various programmable delay times may be implemented to meet the criteria of a particular application.

The circuit 114 may implement a finite impulse response (FIR) filter circuit. The circuit 114 is generally operational to generate the signals P and N by filtering the signals RM and DLY. The signal P may be active starting a delay period after the read memory signal RM transitions from the low state to the high state and inactive otherwise. The signal N may be active when the read memory signal RM transitions from the high state to the low state and inactive otherwise. While the signal P is active, the circuit circuits 126 and 128 may pull up the read signal R. While the signal P is inactive, the circuits 126 and 128 may show a high impedance between the wire 130 carrying the read signal R and the positive rail VDD. While the signal N is active, the circuits 126 and 128 may pull down the read signal R. While the signal N is inactive, the circuits 126 and 128 may show a high impedance between the wire 130 carrying the read signal R and the negative rail GND. A truth table for the generation of the signals P and N is generally illustrated in Table II as follows:

TABLE II

| DLY | RM | P | N |
|---|---|---|---|
| 0 | 0 | Inactive | Inactive |
| 0 | 1 | Inactive | Inactive |
| 1 | 0 | Inactive | Active |
| 1 | 1 | Active | Inactive |

The circuit 122 may implement a pre-driver circuit. The circuit 122 is generally operational to generate a pair of signals (e.g., RP and RN) based on the read memory signal RM. The signal RP may be received by a pull up input port of the circuit 124. The signal RN may be received by a pull down input port of the circuit 124. The read memory signal RM may control half of the parallel pull up impedances and half of the parallel pull down impedances in the circuit 120a. While the read memory signal RM is in the high state, the signals RP and RN may cause the circuit 124 to drive the read signal R to the positive rail VDD. While the read memory signal RM is in the low state, the signals RP and RN may cause the circuit 124 to drive the read signal R to the negative rail GND.

The circuit 124 may implement a driver circuit. The circuit 124 is generally operational to pull the read signal R up to the positive rail VDD or down to the negative rail GND. The circuit 124 generally comprises a pair of devices (or transistors) QA and QB and a pair of impedance devices (or resistors) RUP and RDN.

The read signal R may be pulled up through the resistor RUP to the positive rail VDD while the transistor QA is switched on (or conductive). While the transistor QA is switched off (or nonconductive), the read signal R may see a high impedance to the positive rail VDD. The read signal R may be pulled down through the resistors RDN to the negative rail GND while the transistor QB is switched on (or conductive). While the transistor QB is switched off (or nonconductive), the read signal R may see a high impedance to the negative rail GND.

The circuit 126 may implement a pre-driver circuit. The circuit 122 is generally operational to generate a signal (e.g., FP) by amplifying the signal P. The circuit 122 may also be operational to generate a signal (e.g., FN) by amplifying the signal N. The signal FP may be received by a pull up input port of the circuit 128. The signal FN may be received by a pull down input port of the circuit 128. The signals P and N may control half of the parallel pull up impedances and half of the parallel pull down impedances in the circuit 120a. While the signal P is in the high state, the signal FP may be in the high state and cause the circuit 128 to drive the read signal R to the positive rail VDD. While the signal P is in the low state, the signal FP may be in the low state and cause the circuit 128 to present a high impedance from the read signal R to the positive rail VDD. While the signal N is in the high state, the signal FN may in the high state and cause the circuit 128 to drive the read signal R to the negative rail GND. While the signal N is in the low state, the signal FN may be in the low state and cause the circuit 128 to present a high impedance from the read signal R to the negative rail GND.

The circuit 128 may implement a driver circuit. The circuit 124 is generally operational to pull the wire 130 carrying the read signal R up to the positive rail VDD, down to the negative rail GND or present a high impedance between the wire and the power supply rails VDD and GND. The circuit 128 generally comprises a pair of devices (or transistors) QC and QD and a pair of impedance devices (or resistors) FUP and FDN.

The read signal R may be pulled up through the resistor FUP to the positive rail VDD while the transistor QC is switched on (or conductive). While the transistor QC is switched off (or nonconductive), the read signal R may see a high impedance to the positive rail VDD. The read signal R may be pulled down through the resistors FDN to the negative rail GND while the transistor QD is switched on (or conductive). While the transistor QD is switched off (or nonconductive), the read signal R may see a high impedance to the negative rail GND.

In various embodiments, the impedance values of the resistors RUP, RDN, FUP and FDN may be selected to provide proper termination of the wire 130 carrying the read signal R. A resistance value of each resistor RUP and RDN generally ranges from 20 to 100 ohms. A resistance value of each resistor FUP and FDN generally ranges from 100 to 500 ohms. In some embodiments, the normal termination impedance may be specified to match a standard impedance value (e.g., 34 ohms according to the DDR4 standard). For example, to obtain a normal impedance of 34 ohms on the pull up side of the wire 130, the resistor RUP may have a value of 40 ohms and the resistor FUP may have a value of 240 ohms. After the pull up de-emphasis period, the resistors RUP and FUP may be connected in parallel to the positive rail VDD through the respective transistors QA and QC. The parallel combination of the resistors RUP and FUP (e.g., RUP∥FUP, where the symbol "∥" means "in parallel") may be approximately 34 ohms (e.g., 40 ohms∥240 ohms). The transistors QB and QD may be switched off to present a high impedance from the wire 130 to the negative rail GND. The normal impedance looking into the circuit 120a along the wire 130 may be the approximately 34 ohms of the parallel resistors RUP and FUP. The de-emphasized pull up impedance may be the 40 ohms of the resistor RUP.

To obtain a normal impedance of 34 ohms on the pull down side of wire 130 carrying the read signal R, the resistor RDN may have a value of 34 ohms and the resistor FDN may have a value of 240 ohms. After the pull down pre-emphasis period, the resistor RDB may be connected to the negative rail GND through the transistor QB, and the resistor FDN may be isolated from the negative rail GND by switching off the transistor QD. The transistors QA and QC may be switched off and so present a high impedance from the read signal R to the positive rail VDD. The resulting normal impedance looking into the circuit 120a along the wire 130 may be the 34 ohms of the resistor RDN. The pre-emphasis pull down impedance may be approximately 30 ohms of the parallel resistors RDN and FDN (e.g., 34 ohms∥240 ohms). Other impedance values may be implemented for RUP, RDN, FUP and/or FDN to meet the design criteria of a particular implementation.

Figure 6:
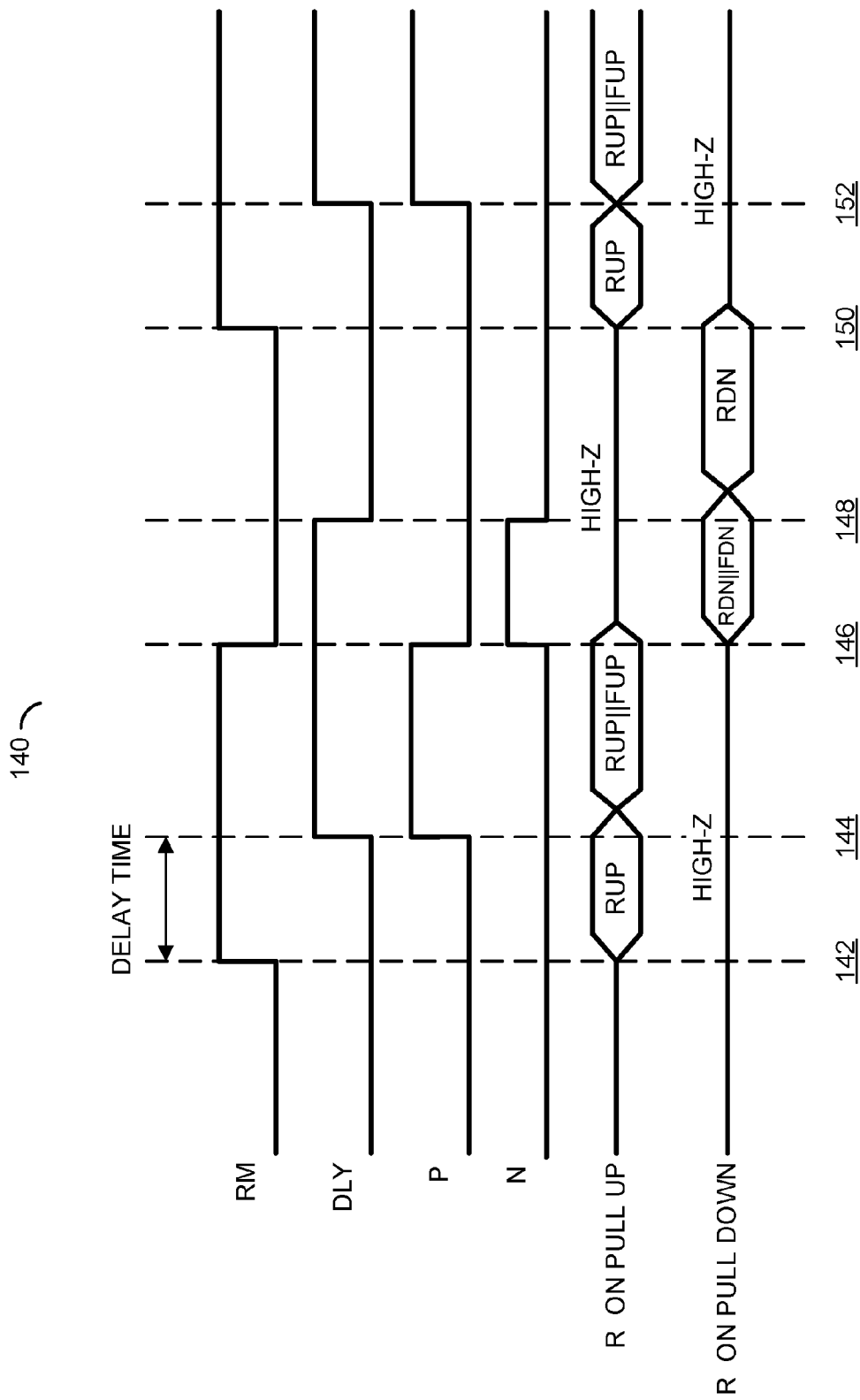
FIG. 6 is a diagram of signal waveforms in the driver circuit.

Referring to FIG. 6, a diagram 140 of signal waveform examples in the circuit 100a is shown. In the illustration, data in the read memory signal RM may change from the logical low state to the logical high state at a time 142. The circuit 120a may response to the logical high state in the read memory signal RM by pulling the read signal R up through the resistor RUP and the transistor QA (e.g., a de-emphasized pull up, 40 ohms). From the time 142 to the time 144, the other transistors QB, QC and QD may be switched off. A current used to pull up the read signal R from the time 142 to the time 144 may flow through the resistor RUP.

The circuit 112 may delay the data in the read memory signal RM by a delay time to generate the signal DLY. After the delay time, the signal DLY may undergo the same change from the logical low state to the logical high state at the time 144 as the read memory signal RM experienced at the time 142. The circuit 114 may respond to the logical high state in both the read memory signal RM and the signal DLY by activating the signal P (e.g., the logical high state). The active signal P may cause the circuit 120a to switch on the transistor QC and contribute to the pull up of the read signal R through the resistor FUP (e.g., the normal pull up, 34 ohms). A total current used to pull up the read signal R from the time 144 to the time 146 may flow through both resistors RUP and FUP and so is larger than the pull up current from the time 142 to the time 144.

The read data in the read memory signal RM may change from the logical high state to the logical low state at the time 146. The circuit 110a may respond to the logical low state of the read memory signal RM by activating the signal N (e.g., the logical high state) and deactivating the signal P (e.g., the logical low state). The circuit 120a may respond to the logical low state of the read memory signal RM and the inactive signal P by switching off the transistors QA and QC, respectively. The circuit 120a may respond to the logical low state of the read memory signal RM and the active signal N by switching on the transistors QB and QD, respectively. While both transistors QB and QD are switched on, a total current used to pull down the read signal R may flow through the resistors RDN and FDN from the time 146 until a time 148 (e.g., a pre-emphasized pull down, 30 ohms). From the time 142 to the time 148, the circuit 120a may present a high impedance (e.g., high-z) from the wire 130 to the negative rail GND.

At the time 148, the signal DLY may change from the logical high state to the logical low state. The circuit 110a may respond to both the read memory signal RM and the signal DLY in the logical low state by deactivating the signal N (e.g., the logical low state). The circuit 120a may respond to the inactive signal N by switching off the transistor QD. From the time 148 to the time 150, the current used to pull down the read signal R may flow through the resistor RDN and the transistor QB (e.g., a normal pull down, 34 ohms).

At the time 150, the read memory signal RM may change again from the logical low state to the logical high state. The circuits 120a may respond to the logical high state in the read memory signal RM by switching off the transistor QB and switching on the transistor QA to begin a next pull up of the read signal R. The circuit 110a may respond to the read memory signal RM in the logical high state and the signal DLY in the logical low state by keeping both the signals P and N inactive. The circuit 120a may respond to both inactive signals P and N by keeping the transistors QC and QD switched off. The pull up current from the time 150 to a time 152 may flow through the resistor RUP (e.g., a de-emphasized pull up, 40 ohms). The de-emphasized pull up generally ends at the time 152 when the signal DLY changes from the logical low state to the logical high state, the transistor QC is switched on, and the resistor FUP is used to help pull up the read signal R. From the time 146 to the time 150, the circuit 120a may present a high impedance from the wire 30 to the positive rail VDD.

Figure 7:
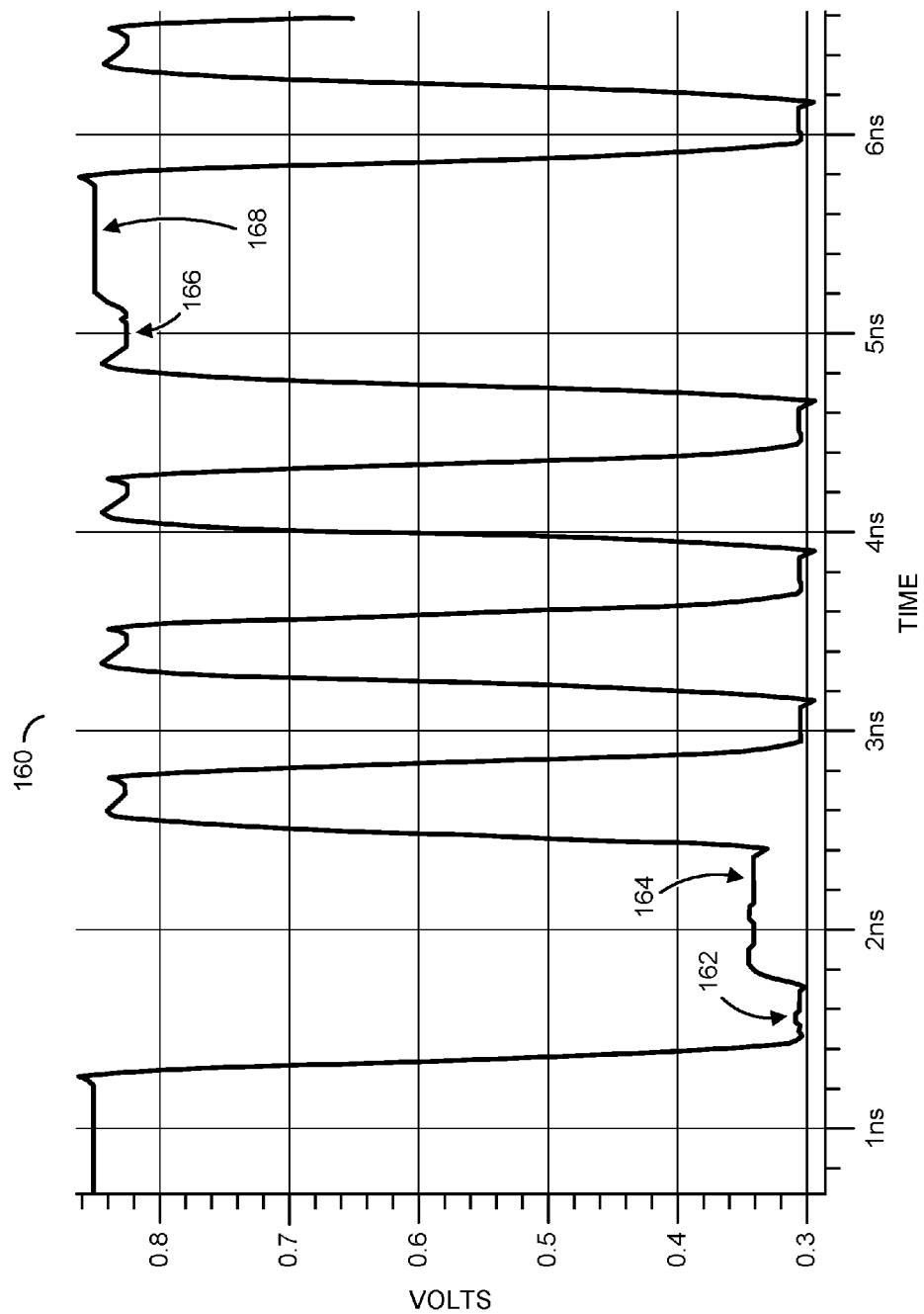
FIG. 7 is a graph of a simulated waveform illustrating pre-emphasis and de-emphasis.

Referring to FIG. 7, a graph 160 of an example simulated waveform illustrating the pre-emphasis and the de-emphasis is shown. An x-axis of the graph 160 may represent time (e.g., measured in seconds) in a range of 1 nanosecond to 6 nanoseconds. A y-axis of the graph 160 may represent a voltage of the read signal R. In the example, the wire 130 may be loaded with a 50 ohm resistance to the positive rail Vdd and a 50 ohm resistance to the negative rail GND.

A falling (or pull down) edge of the read signal R may experience the pre-emphasis 162 for a fixed amount of time. Afterwards, the read signal R may be pulled down with the normal emphasis 164. A rising (or pull up) edge of the read signal R may experience the de-emphasis 166 for the fixed amount of time. Afterwards, the read signal R may be pulled up with the normal emphasis 168.

The asymmetrical driver emphasis technique of the present invention generally improves output eye performance. The improved output eye performance may benefit reliability, data transfer frequencies and/or receiver margin testing. The ability to adjust the delay time may enable customization of the pre-emphasis/de-emphasis to various conditions of the memory module (or board or card), the connectors, the pins, the traces and/or the motherboard.

While FIG. 4 shows the driver circuit 100a in the context of the data buffer circuit 90a sending read data during read cycles, copies of the driver circuits 100a-100n may be implemented at other locations, other data paths and/or other control paths. In various embodiments, copies of the driver circuits 100a-100n may be located at the other end of the data bus 30 to improve various signals generated by the host circuit 10 during write cycles. For example, the memory controller 20 may include copies of the driver circuits 100a-100n to modify the write data sent in the signals DQa-DQn to the memory modules 50a-50n. In another example, copies of the driver circuits 100a-100n may be included in the memory controller 20 to modify address, command data and/or clocking signals sent across the data bus 30. Instances of the driver circuits 100a-100n may also be implemented in other circuitry within the memory modules 50a-50n. For example, copies of the driver circuits 100a-100n may be included in the RCD circuit 102 to modify signals sent across the data bus 30.

The functions and structures illustrated in the diagrams of FIGS. 1 to 6 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   an interface configured to generate a read signal that carries read data from a memory channel; and
   a circuit configured to (i) modify said read signal with a de-emphasis on each pull up of said read signal and a pre-emphasis on each pull down of said read signal and (ii) transfer said read signal as modified to a memory controller.

2. The apparatus according to claim 1, wherein said circuit is further configured to generate a delayed signal by delaying said read signal as received from said interface.

3. The apparatus according to claim 2, wherein said de-emphasis comprises pulling up said read signal through a first impedance while said read signal is in a high state and said delayed signal is in a low state.

4. The apparatus according to claim 3, wherein said de-emphasis further comprises pulling up said read signal through a second impedance while both said read signal and said delayed signal are in said high state.

5. The apparatus according to claim 4, wherein said second impedance is lower than said first impedance.

6. The apparatus according to claim 2, wherein said pre-emphasis comprises pulling down said read signal through a first impedance while said read signal is in a low state and said delayed signal is in a high state.

7. The apparatus according to claim 6, wherein said pre-emphasis further comprises pulling down said read signal through a second impedance while both said read signal and said delayed signal are in said low state.

8. The apparatus according to claim 7, wherein said second impedance is higher than said first impedance.

9. The apparatus according to claim 1, wherein said interface and said circuit form part of a data buffer of a double data rate fourth generation synchronous dynamic random-access memory module.

10. A method of asymmetrical emphasis in a memory data bus driver, comprising the steps of:
receiving a read signal that carries read data from a memory channel;
modifying a read signal in a circuit with a de-emphasis on each pull up of said read signal and a pre-emphasis on each pull down of said read signal; and
transferring said read signal as modified to a memory controller.

11. The method according to claim 10, further comprising the step of:
generating a delayed signal by delaying said read signal as received.

12. The method according to claim 11, wherein said de-emphasis comprises pulling up said read signal through a first impedance while said read signal is in a high state and said delayed signal is in a low state.

13. The method according to claim 12, wherein said de-emphasis further comprises pulling up said read signal through a second impedance while both said read signal and said delayed signal are in said high state.

14. The method according to claim 13, wherein said second impedance is lower than said first impedance.

15. The method according to claim 11, wherein said pre-emphasis comprises pulling down said read signal through a first impedance while said read signal is in a low state and said delayed signal is in a high state.

16. The method according to claim 15, wherein said pre-emphasis further comprises pulling down said read signal through a second impedance while both said read signal and said delayed signal are in said low state.

17. The method according to claim 16, wherein said second impedance is higher than said first impedance.

18. The method according to claim 11, wherein the steps are performed in a data buffer of a double data rate fourth generation synchronous dynamic random-access memory module.

* * * * *